(12) United States Patent
Hall et al.

(10) Patent No.: US 8,722,493 B2
(45) Date of Patent: May 13, 2014

(54) LOGIC TRANSISTOR AND NON-VOLATILE MEMORY CELL INTEGRATION

(75) Inventors: Mark D. Hall, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/442,142

(22) Filed: Apr. 9, 2012

(65) Prior Publication Data

US 2013/0264633 A1  Oct. 10, 2013

(51) Int. Cl.
*H01L 21/336* (2006.01)

(52) U.S. Cl.
USPC ........... 438/283; 438/157; 438/176; 438/195; 438/588; 257/250; 257/331; 257/365; 257/E21.623; 257/E21.624; 257/E21.637

(58) Field of Classification Search
CPC .......................... H01L 27/04; H01L 27/10894
USPC .......... 438/157, 176, 195, 283, 588; 257/250, 257/331, 365, E21.623, E21.624, E21.637
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,194,301 B1 | 2/2001 | Radens et al. | |
| 6,235,574 B1 | 5/2001 | Tobben et al. | |
| 6,333,223 B1 | 12/2001 | Moriwaki et al. | |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 * | 8/2004 | Clevenger et al. | 257/388 |
| 6,939,767 B2 | 9/2005 | Hoefler et al. | |
| 7,154,779 B2 | 12/2006 | Mokhlesi et al. | |
| 7,202,524 B2 | 4/2007 | Kim et al. | |
| 7,208,793 B2 * | 4/2007 | Bhattacharyya | 257/314 |

(Continued)

FOREIGN PATENT DOCUMENTS

WO 2009058486 5/2009

OTHER PUBLICATIONS

Mao, P., et al., "Nonvolatile memory devices with high density ruthenium nanocrystals", Applied Physicsw Letters, vol. 93, Issue 24, Electronic Transport and Semiconductors, 2006.

(Continued)

*Primary Examiner* — Jarrett Stark
*Assistant Examiner* — Mohammad M Hoque
(74) *Attorney, Agent, or Firm* — James L. Clingan, Jr.; Joanna G. Chiu

(57) ABSTRACT

A first conductive layer and an underlying charge storage layer are patterned to form a control gate in an NVM region. A first dielectric layer and barrier layer are formed over the control gate. A sacrificial layer is formed over the barrier layer and planarized. A first patterned masking layer is formed over the sacrificial layer and control gate in the NVM region which defines a select gate location laterally adjacent the control gate in the NVM region. A second masking layer is formed in the logic region which defines a logic gate location. Exposed portions of the sacrificial layer are removed such that a first portion remains at the select gate location. A second dielectric layer is formed over the first portion and planarized to expose the first portion. The first portion is removed to result in an opening at the select gate location which exposes the barrier layer.

18 Claims, 7 Drawing Sheets

(56) References Cited

U.S. PATENT DOCUMENTS

| | | |
|---|---|---|
| 7,271,050 B2 | 9/2007 | Hill |
| 7,365,389 B1 | 4/2008 | Jeon et al. |
| 7,391,075 B2 | 6/2008 | Jeon et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 * | 9/2010 | Winstead et al. ............. 438/257 |
| 7,816,727 B2 | 10/2010 | Lai et al. |
| 7,906,396 B1 | 3/2011 | Chiang et al. |
| 7,989,871 B2 | 8/2011 | Yasuda |
| 7,999,304 B2 | 8/2011 | Ozawa et al. |
| 8,063,434 B1 | 11/2011 | Polishchuk et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 * | 12/2012 | Chen et al. .................... 438/595 |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Hall et al. |
| 2002/0061616 A1 | 5/2002 | Kim et al. |
| 2004/0075133 A1 | 4/2004 | Nakagawa et al. |
| 2006/0046449 A1 | 3/2006 | Liaw |
| 2007/0077705 A1 | 4/2007 | Prinz et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0050875 A1 | 2/2008 | Moon et al. |
| 2008/0121983 A1 | 5/2008 | Seong et al. |
| 2008/0145985 A1 | 6/2008 | Chi |
| 2008/0185635 A1 | 8/2008 | Yanagi et al. |
| 2008/0237700 A1 | 10/2008 | Kim et al. |
| 2008/0290385 A1 | 11/2008 | Urushido |
| 2008/0308876 A1 | 12/2008 | Lee et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2012/0104483 A1 | 5/2012 | Shroff et al. |
| 2012/0132978 A1 | 5/2012 | Toba et al. |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267074 A1 | 10/2013 | Hall et al. |

OTHER PUBLICATIONS

Pei, Y., et al., "MOSFET Nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Chen, J.H., et al., "Nonvolatile Flash Memory Device Using Ge nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.

U.S. Appl. No. 12/915,726, Shroff M., et al, "Non-Volatile Memory and Logic Circuit Process Integration", filed Oct. 29, 2010.

U.S. Appl. No. 13/077,491, Shroff, M., et al, "Non-Volatile Memory and Logic Circuit Process Integration", filed Mar. 31, 2011.

U.S. Appl. No. 13/307,719, Shroff, M., et al, "Logic and Non-Volatile Memory (NVM) Integration", filed Nov. 30, 2011.

U.S. Appl. No. 13/343,331, Shroff, M., et al, "Non-Volatile Memory (NVM) and Logic Integration", filed Jan. 4, 2012.

Mao, P., et al, "Nonvolatile Memory Characteristics with Embedded High Density Ruthenium Nanocrystals", http://iopscience.iop.org/0256-307X/26/5/056104, Chinese Physics Letters, vol. 26, No. 5, 2009.

Kang, T.K., et al, "Improved characteristics for Pd nanocrystal memory with stacked HfAIO-SiO2 tunnel layer", Sciencedirect. com, Solid-State Electronics, vol. 61, Issue 1, Jul. 2011, pp. 100-105, http://www.sciencedirect.com/science/article/pii/S0038110111000803.

U.S. Appl. No. 13/402,426, Hall, et al., Office Action—Notice of Allowance, mailed May 3, 2013.

U.S. Appl. No. 13/789,971, Hall, et al., Office Action—Notice of Allowance, mailed May 15, 2013.

Kang, T.K., et al., "Improved characteristics for Pd nanocrystal memory with stacked HfAIO-Si02 tunnel layer", Sciencedirect.com, Solid-State Electronics, vol. 61, Issue 1, Jul. 2011, pp. 100-105, http://wwww.sciencedirect.com/science/article/pii/50038110111000803.

Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.

U.S. Appl. No. 13/491,771, Hall et al, "Integrating Formation of a Replacement Ggate Transistor and A Non-Volatile Memory Cell Using a High-K Dielectric", Office Action—Rejection, Sep. 9, 201.

U.S. Appl. No. 13/907,491, Hall, M.D., et al., "Logic Transistor and Non-Volatile Memory Cell Integration", Office Action—Rejection, Sep. 3, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Restriction, Jun. 21, 2013.

U.S. Appl. No. 13/781,727, Shroff, M., et al., "Methods of Making Logic Transistors and non-Volatile Memory Cells", Office Action—Rejection, Aug. 22, 2013.

(56) References Cited

OTHER PUBLICATIONS

U.S. Appl. No. 13/077,491, Shroff, M., et al., "Non-Volatile Memory and Logic Circuit Process Integration", Office Action—Rejection, Aug. 15, 2012.

U.S. Appl. No. 13/077,491, Shroff, M., et al., "Non-Volatile Memory and Logic Circuit Process Integration", Office Action—Rejection, Feb. 6, 2013.

U.S. Appl. No. 13/077,491, Shroff, M., et al., "Non-Volatile Memory and Logic Circuit Process Integration", Office Action—Allowance, Jun. 18, 2013.

U.S. Appl. No. 13/077,501, Shroff, M., et al., "Non-Volatile Memory and Logic Circuit Process Integration", Office Action—Allowance, Nov. 26, 2012.

U.S. Appl. No. 13/313,179, Shroff, M., et al., "Method of Protecting Against Via Failure and Structure Therefor", Office Action—Rejection, Aug. 15, 2013.

U.S. Appl. No. 13/307,719, Shroff, M., et al., "Logic and Non-Volatile Memory (NVM) Integration", Office Action—Allowance, May 29, 2013.

U.S. Appl. No. 13/343,331, Shroff, M., et al., "Non-Volatile Memory (NVM) and Logic Integration", Office Action—Rejection, Mar. 13, 2013.

U.S. Appl. No. 13/343,331, Shroff, M., et al., "Non-Volatile Memory (NVM) and Logic Integration", Office Action—Allowance, Jun. 24, 2013.

U.S. Appl. No. 13/441,426, Shroff, M., et al., "Non-Volatile Memory (Nvm) and Logic Integration", Office Action—Allowance, Sep. 9, 2013.

U.S. Appl. No. 13/780,574, Hall, M.D., et al., Non-Volatile Memory (NVM) and Logic Integration, Office Action—Allowance, Sep. 6, 2013.

U.S. Appl. No. 13/491,760, Shroff, M., et al., "Integrating Formation of a Replacement Gate Transistor and a Non-Volatile Memory Cell Using an Interlayer Dielectric", Office Action—Allowance, Jul. 1, 2013.

U.S. Appl. No. 13/491,771, Hall et al., "Integrating Formation of a Replacement Gate Transistor and a Non-Volatile Memory Cell Using a High-K Dielectric", Office Action—Allowance, mailed Jan. 16, 2014.

U.S. Appl. No. 13/790,225, Hall, M., et al., "Integrating Formation of a Replacement Gate Transistor and a Non-Volatile Memory Cell Having Thin Film Storage", Office Action—Allowance, mailed Dec. 24, 2013.

U.S. Appl. No. 13/790,014, Hall, M., et al., "Integrating Formation of a Logic Transistor and a Non-Volatile Memory Cell Using a Partial Replacement Gate Technique", Office Action—Allowance, mailed Dec. 24, 2013.

U.S. Appl. No. 13/781,727, Shroff, M., et al., "Methods of making Logic Transistors and Non-Volatile Memory Cells", Office Action—Allowance, mailed Jan. 31, 2014.

U.S. Appl. No. 13/343,331, Shroff, M., et al., "Non-Volatile Memory (NVM) and Logic Integration", Office action—Allowance, mailed Nov. 8, 2013.

U.S. Appl. No. 13/780,574, Hall, M., et al., "Non-Volatile Memory (NVM) and Logic Integration", Office Action—Allowance, mailed Dec. 24, 2013.

U.S. Appl. No.13/780,591, Hall, M., et al., "Non-Volatile Memory (NVM) and Logic Integration", Office Action—Allowance, mailed Nov. 22, 2013.

U.S. Appl. No. 13/441,426, Shroff, M., et al., "Non-Volatile Memory (NVM) and Logic Integration", Office Action—Allowance, Feb. 21, 2014.

U.S. Appl. No. 13/790,014, Hall, M., et al., "Integrating Formation of a Logic Transistor and a Non-Volatile Memory Cell Using a Partial Replacement Gate Technique", Office Action—Allowance, mailed Mar. 3, 2014.

U.S. Appl. No. 13/491,771, Hall et al., "Integrating Formation of a Replacement Gate Transistor and a Non-Volatile Memory Cell Using a High-K Dielectric", Office Action—Allowance, mailed Mar. 6, 2014.

U.S. Appl. No. 13/907,491, Hall et al., "Logic Transistor and Non-Volatile Memory Cell Integration", Office Action—Allowance, mailed Mar. 11, 2014.

U.S. Appl. No. 13/790,225, Hall et al., "Integrating Formation of a Replacement Gate Transistor and a Non-Volatile Memory Cell Having Thin Film Storage", Office Action—Allowance, mailed Mar. 12, 2014.

\* cited by examiner

LOGIC TRANSISTOR AND NON-VOLATILE MEMORY CELL INTEGRATION

CROSS-REFERENCE TO RELATED APPLICATION

This application is related to U.S. patent application Ser. No. 13/402,426, filed on Feb. 22, 2012, titled "NON-VOLATILE MEMORY CELL AND LOGIC TRANSISTOR INTEGRATION," naming Mark D. Hall and Mehul D. Shroff as inventors, and assigned to the current assignee hereof.

BACKGROUND

1. Field

This disclosure relates generally to non-volatile memories, and more specifically, to integrating non-volatile memories with logic transistors on the same integrated circuit.

2. Related Art

Many semiconductor devices include, or embed, non-volatile memory (NVM) transistors with other transistor types on the same integrated circuit (IC). The manufacturing processes for the different transistor types may not be the same, requiring that the processes be integrated. For example, to integrate NVM with, for example, CMOS (complementary metal oxide semiconductor), the CMOS process may be modified to include the process steps necessary to fabricate the NVM memory cell and the supporting devices.

Flash NVM is commonly embedded in, for example, system-on-a-chip (SoC) integrated circuits having CMOS logic circuitry. The flash NVM may include a floating gate comprising polysilicon, or use a charge storage layer comprising nanocrystals or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

What is needed is a process integration methodology to efficiently embed a NVM cell array with metal gate/high-k dielectric logic transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell and a logic transistor efficiently integrates NVM and logic on a single integrated circuit. This integration provides for important features to be formed at stages in the process that allow for flexibility in the choice of materials for critical dielectric layers and for storage layers. With regard to storage layers, this includes flexibility in choosing between floating gate and nanocrystals as well as choosing from among several nanocrystal materials. These choices of storage layers and dielectric layers are in the context of a dummy gate process in which the work function setting material is retained while the dummy top gate is replaced by the final top gate. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
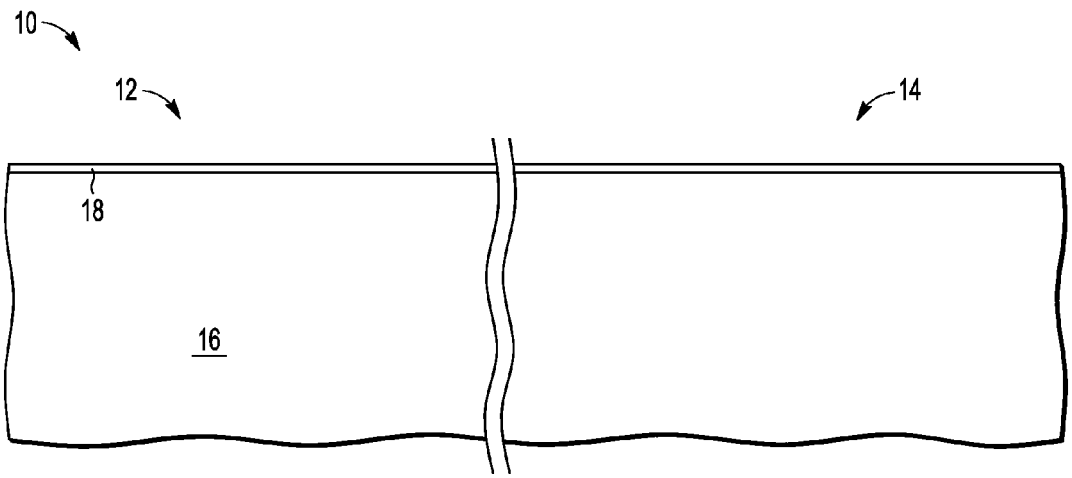
FIG. 1 is a cross section of a semiconductor device at a stage in processing according to an embodiment.

Shown in FIG. 1 is a semiconductor device 10 having a semiconductor substrate 16, an NVM region 12 in and over a portion of substrate 16, a logic region 14 in and over a portion of substrate 16, and a hard mask layer 18 over substrate 16. In and over the same substrate 16, there may be other regions as well. A process for forming a single logic transistor and a single NVM cell will be shown in subsequent figures and are exemplary of other transistors and memory cells to be formed in those regions. Hard mask layer 18 may be oxide and may be about 100 Angstroms. Other materials and thicknesses may also be used.

Figure 2:
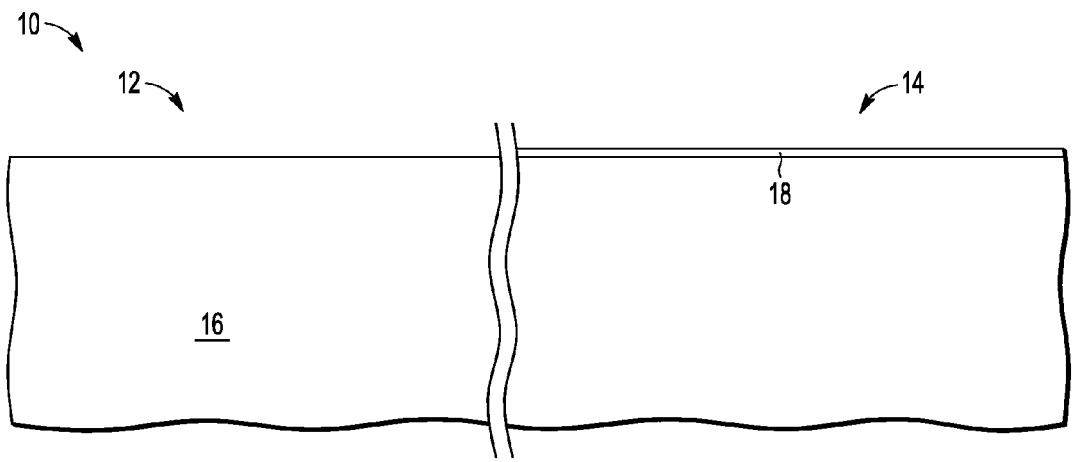
FIG. 2 is a cross section of the semiconductor device of FIG. 1 at a subsequent stage in processing.

Shown in FIG. 2 is semiconductor device 10 after removing hard mask layer 18 from NVM region 12. A mask, not shown, is used for this etch.

Figure 3:
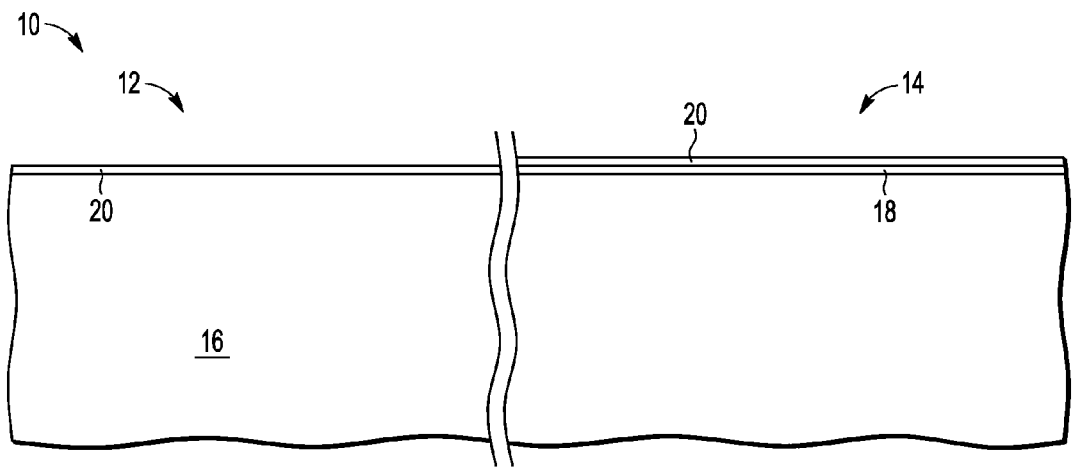
FIG. 3 is a cross section of the semiconductor device of FIG. 2 at a subsequent stage in processing.

Shown in FIG. 3 is semiconductor device 10 after depositing a charge storage layer 20 over NVM region 12 on substrate 16 and over logic region 14 on hard mask layer 18.

Figure 4:
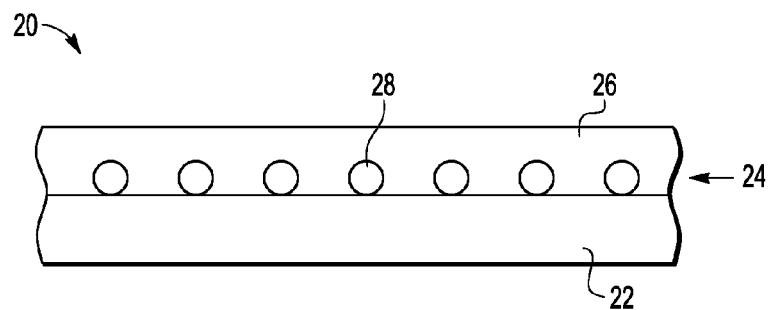
FIG. 4 is a portion of the semiconductor device shown in FIG. 3 in more detail.

Shown in FIG. 4 is charge storage layer 20 in more detail. Charge storage layer 20 has a dielectric layer 22 on substrate 16, a plurality of nanocrystals 24 on dielectric layer 22 including an exemplary nanocrystal 28, and a dielectric layer 26 on dielectric layer 22 and on and around nanocrystals 24. Dielectric layer 22 may be a high-k dielectric which may be hafnium oxide. Dielectric layer 22 is the dielectric layer through which charge flows to and from nanocrystals 24 for program and erase as well as the gate dielectric between nanocrystals 24 and a channel. Nanocrystals are typically polysilicon but nanocrystals 24 may also be metallic. Dielectric layer 26 may be a high-k dielectric such as hafnium oxide.

Figure 5:
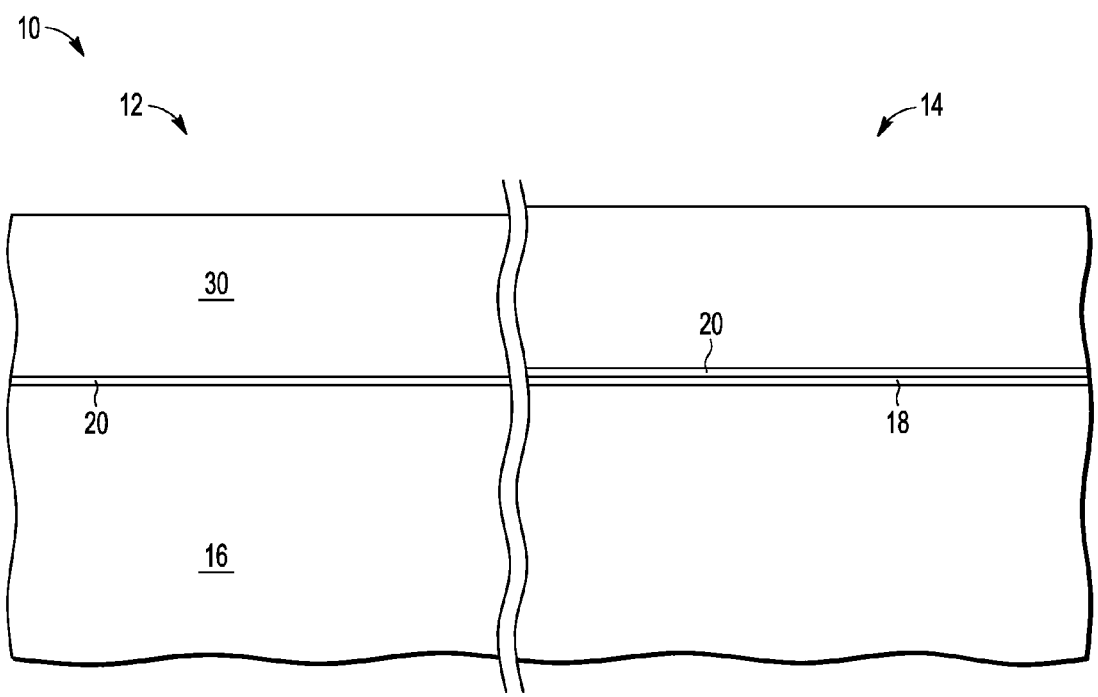
FIG. 5 is a cross section of the semiconductor device of FIG. 3 at a subsequent stage in processing.

Shown in FIG. 5 is a semiconductor device after forming a gate material 30 on charge storage layer 20 in NVM region 12 and logic region 14. Gate material 30 may have a thickness of about 1000 Angstroms. Gate material 30 may be metal which may provide a benefit over polysilicon. Polysilicon may be used as well. Gate material 30 may also be a stack of conductive materials that may include metal and polysilicon.

Figure 6:
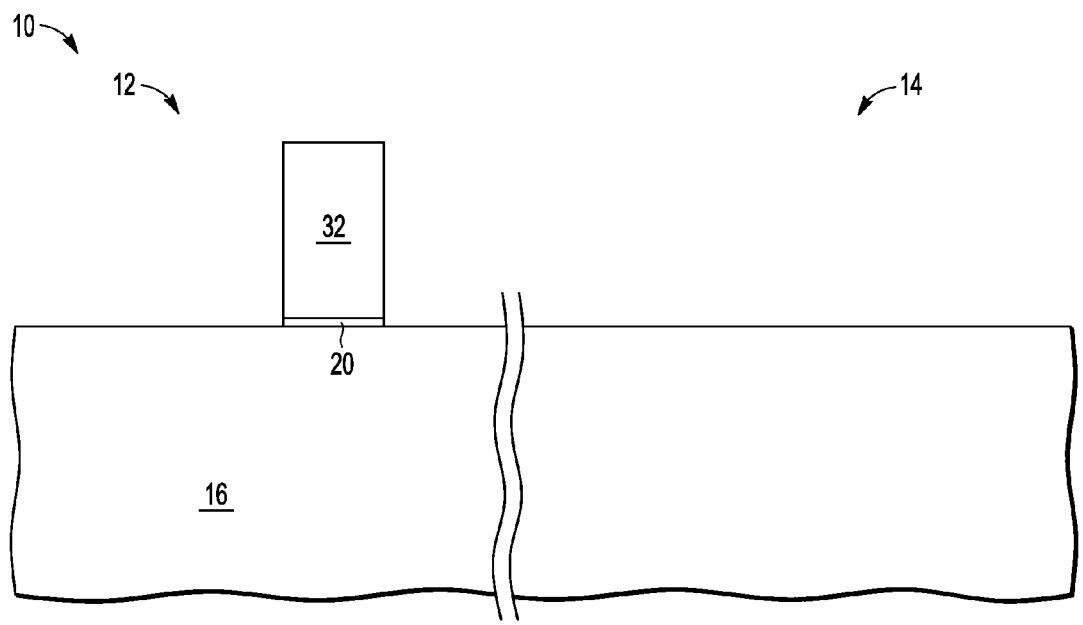
FIG. 6 is a cross section of the semiconductor device of FIG. 5 at a subsequent stage in processing.

Shown in FIG. 6 is semiconductor device 10 after etching gate material 30 and charge storage layer 20. There need not be any change to gate material 30 other than patterning it, but the result is what will be used as a functional structure, control gate 32, in NVM region 12. Gate material 30, charge storage layer 20, and hard mask layer 18 are removed from logic region 14 so that a top surface of substrate 16 will be exposed in logic region 14. The top portion of substrate 16 is also exposed in NVM region 12 except where control gate 32 is present.

Figure 7:
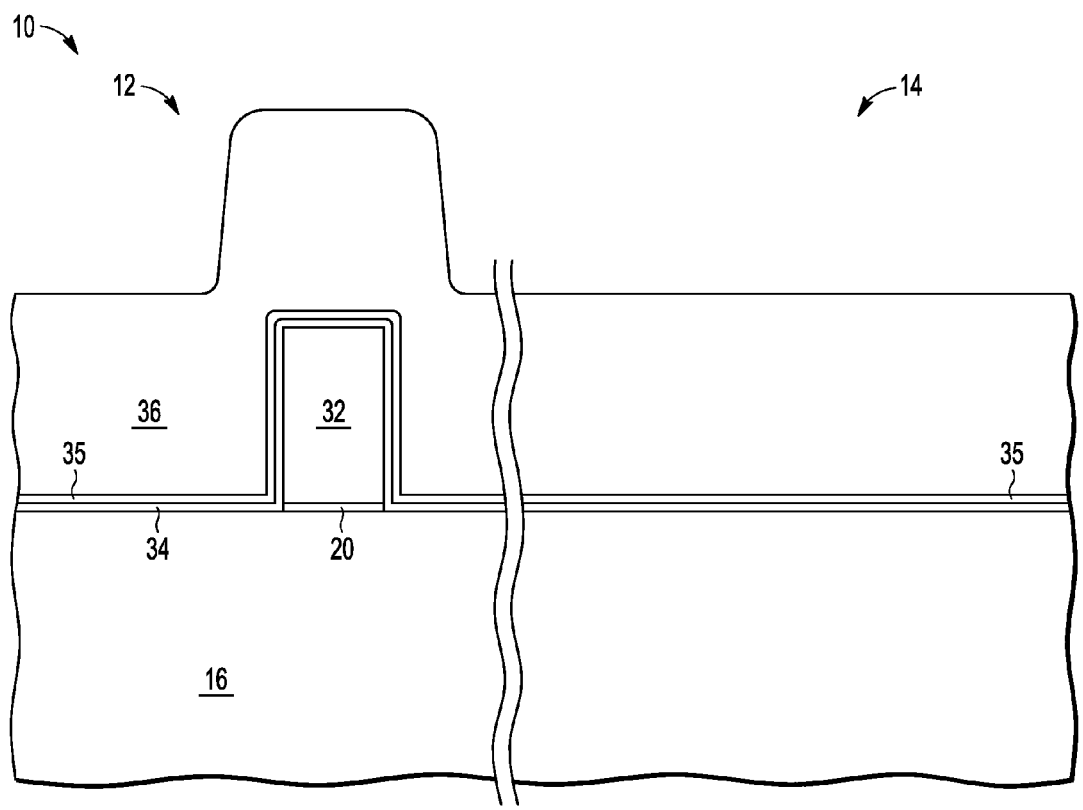
FIG. 7 is a cross section of the semiconductor device of FIG. 6 at a subsequent stage in processing.

Shown in FIG. 7 is semiconductor device 10 after forming a high-k dielectric layer 34 on the exposed portions of NVM region 12 and logic region 14 and on control gate 32, a barrier metal layer 35 on high-k dielectric layer 34, and a replacement layer 36 on barrier layer 35 in NVM region 12 and logic region 14. The lower portion of replacement layer 36 is preferably higher than, but at least as high as, barrier layer 35 where barrier metal layer 35 is over control gate 32. Replacement layer 36 is preferably nitride or polysilicon. It is completely removed eventually so it may be either conductive or insulating. Barrier metal layer 35 may be 100-200 Angstroms, for example, but chosen to be thin but still thick enough to perform a barrier function and to set the work function for the logic and NVM transistors that are being formed.

Figure 8:
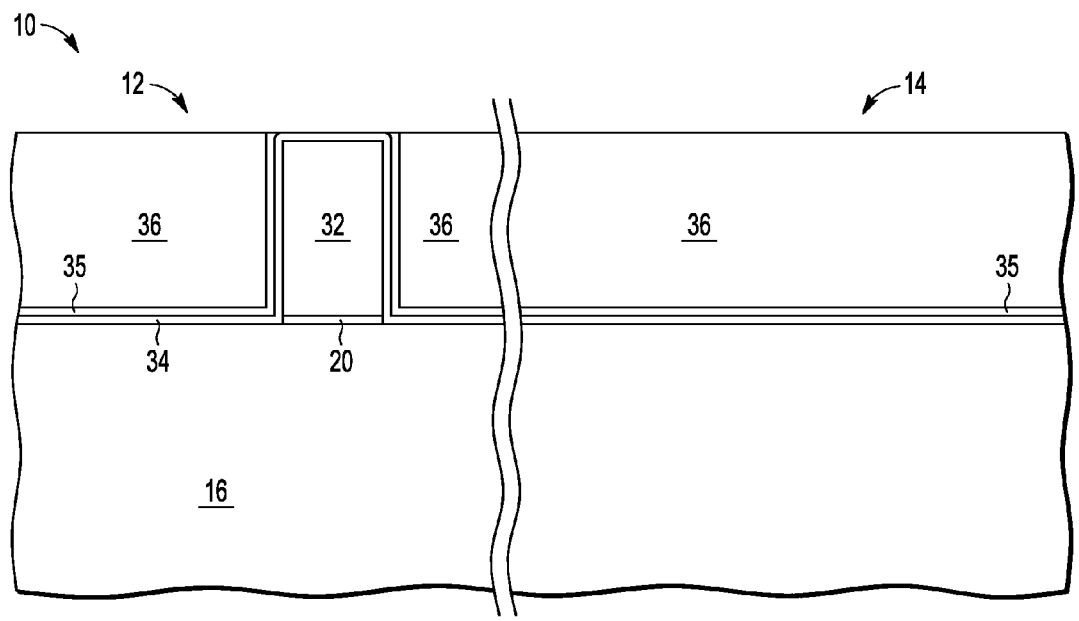
FIG. 8 is a cross section of the semiconductor device of FIG. 7 at a subsequent stage in processing.

Shown in FIG. 8 is semiconductor device 10 after performing a planarization process such as chemical mechanical polishing on replacement layer 36 to leave replacement layer 36 in a planar form having a height about the same as dielectric layer 34 over control gate 32. The CMP process may be preceded by first depositing a sacrificial layer to support the protrusions and thereby reduce the likelihood of failures where the protrusions are. The CMP process can be engineered to remove barrier metal layer 35 or stop before barrier metal layer 35 has been removed. The case shown in FIG. 8 is that the CMP process has fully removed barrier metal layer 35.

Figure 9:
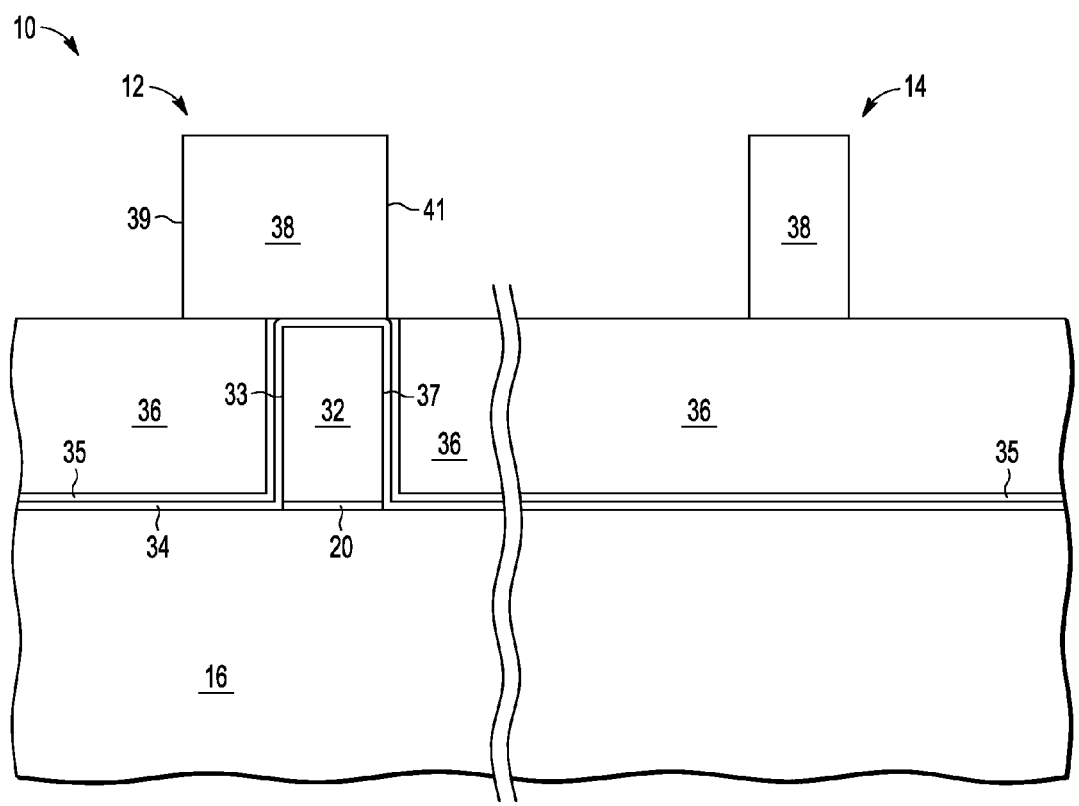
FIG. 9 is a cross section of the semiconductor device of FIG. 8 at a subsequent stage in processing.

Shown in FIG. 9 is semiconductor device 10 after forming patterned photoresist 38 which has a first portion in NVM region 12 over control gate 32 that has a first sidewall 39 extending away from a first sidewall 33 of control gate 32 for defining a dummy gate that will subsequently be replaced by a conductive material that will be used as a select top gate. The first portion of patterned photoresist 38 in NVM region 12 has a second sidewall 41 substantially aligned to dielectric 34 and barrier metal layer 35 where dielectric 34 and barrier metal layer 35 are along a second sidewall 37 of control gate 32. Second sidewall 37 of control gate 32 is opposite first sidewall 33 of control gate 32. The horizontal thickness of dielectric 34 added to the horizontal thickness of barrier metal layer 35 along the sidewalls of control gate 32 is preferably at least twice the alignment tolerance for the second sidewall 41 of photoresist 38 in NVM region 12 so that second sidewall 41 of photoresist 38 in NVM region 12 is neither over control gate 32 nor over replacement layer 36 but only over high-k gate dielectric 34 or barrier metal layer 35 along the second sidewall 37 of control gate 32. Patterned photoresist 38 has a second portion in logic region 14 that will be used to define a gate of a logic transistor.

Figure 10:
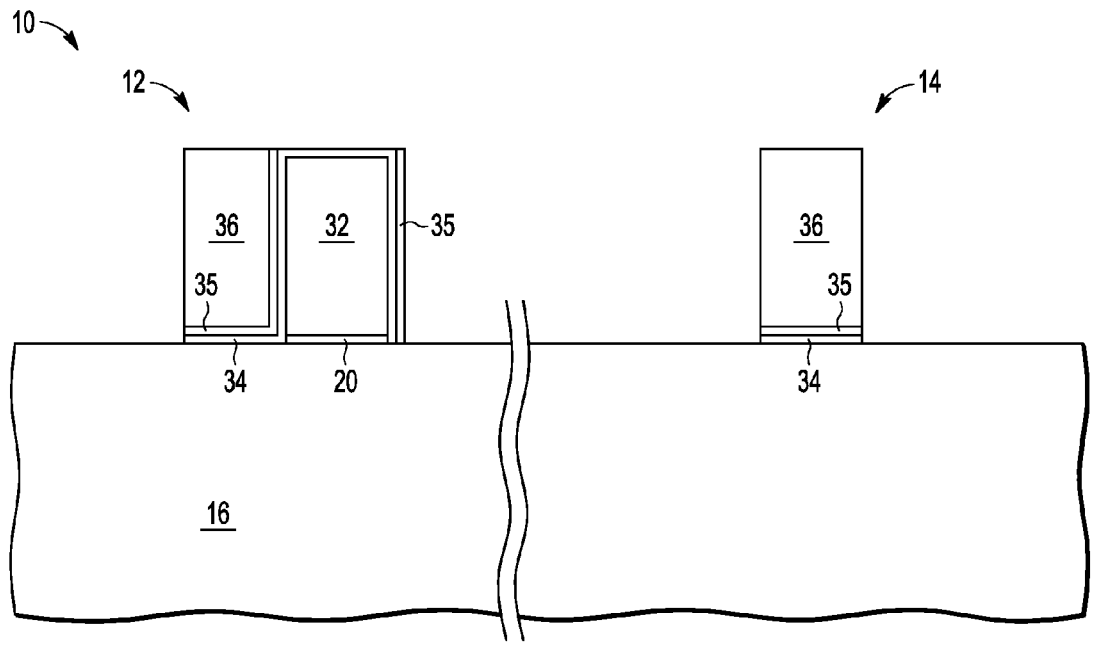
FIG. 10 is a cross section of the semiconductor device of FIG. 9 at a subsequent stage in processing.

Shown in FIG. 10 is semiconductor device 10 after performing an etch using patterned photoresist 38 as a mask leaving a first portion of replacement layer 36 adjacent to control gate 32 in NVM region 12 and a second portion of replacement layer 36 in logic region 14. An etch chemistry change occurs after patterning replacement layer 36 to remove barrier metal layer 35 except along sidewalls 33 and 37 of control gate 32. Barrier metal layer 35 along sidewall 33 is between select gate 32 and the first portion of replacement layer 36. Also a sidewall spacer from barrier metal layer 35 is formed on high-k dielectric 34 that is on sidewall 37. Dielectric 34 remains over control gate 32. The first and second portions of replacement layer 36 will be replaced by gate material.

Figure 11:
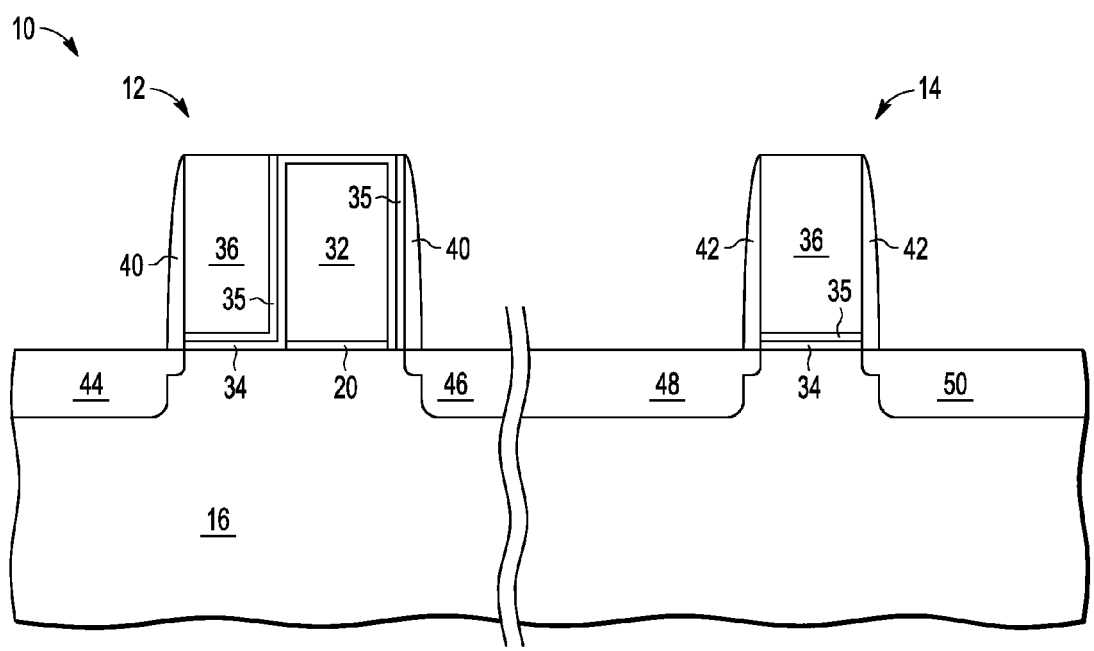
FIG. 11 is a cross section of the semiconductor device of FIG. 10 at a subsequent stage in processing.

Shown in FIG. 11 is semiconductor device 10 after forming sidewall spacers and performing implants in typical fashion for forming transistors resulting in a sidewall spacer 40 around the first portion of replacement layer 36 and control gate 32, a source/drain region 44 in substrate 16 substantially aligned to a first sidewall of the first portion of replacement layer 36, a source/drain region 46 substantially aligned to the second sidewall of control gate 32, a sidewall spacer 42 around the second portion of replacement layer 36, a source/drain region 48 substantially aligned to a first sidewall of the second portion of replacement layer 36, and a source/drain region 50 substantially aligned to a second sidewall of the second portion of replacement layer 36. If the first and second portions of replacement layer 36 were of gate material, there would be a completed NVM cell with the first portion of replacement layer 36 being a select gate and the second portion of replacement layer 36 being a gate of the logic transistor.

Figure 12:
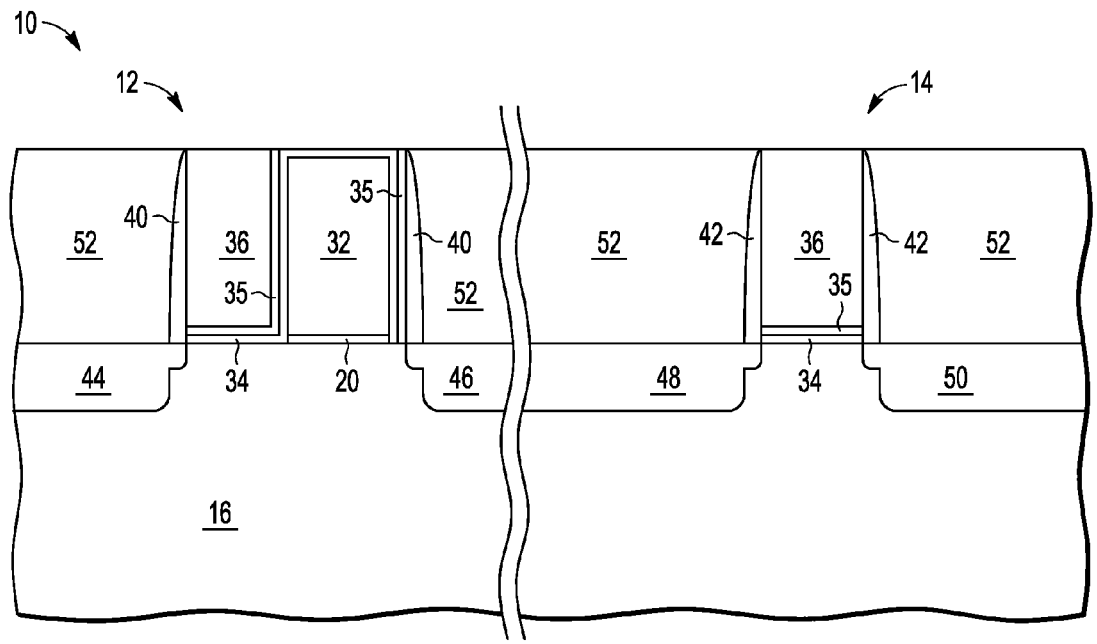
FIG. 12 is a cross section of the semiconductor device of FIG. 11 at a subsequent stage in processing.

Shown in FIG. 12 is semiconductor device 10 after forming an interlayer dielectric (ILD) 52 by deposition followed by CMP. FIG. 12 thus shows ILD 52 having portions around sidewall spacers 40 and 42. The CMP results in top surfaces of both portions of replacement layer 36 being exposed.

Figure 13:
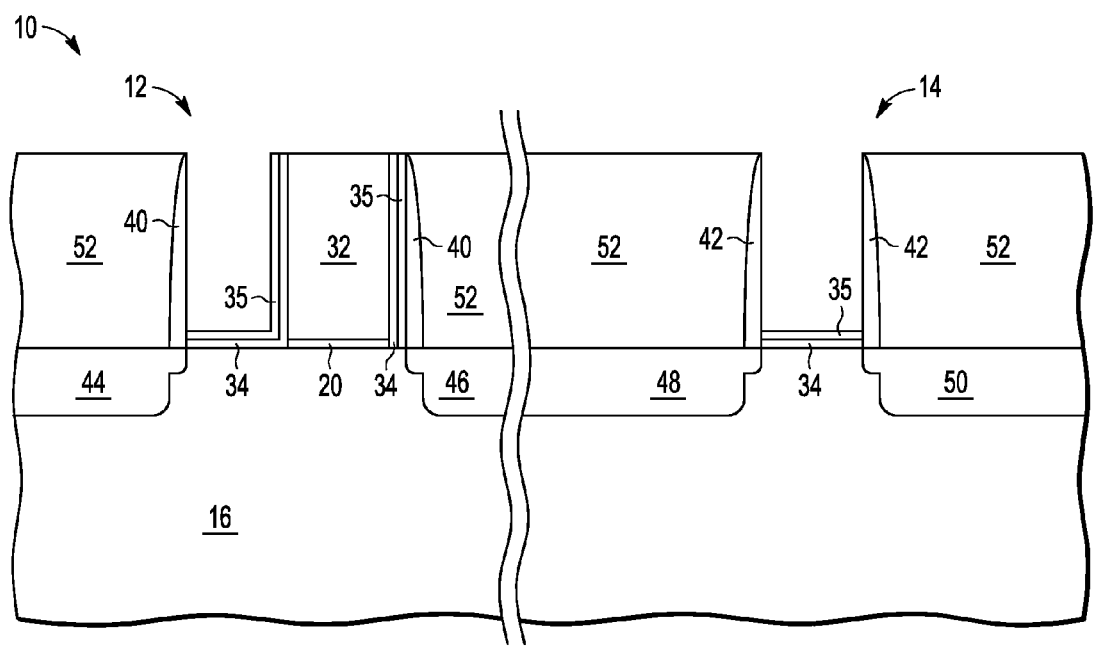
FIG. 13 is a cross section of the semiconductor device of FIG. 12 at a subsequent stage in processing.

Shown in FIG. 13 is semiconductor device 10 after removing both portions of replacement layer 36. This may be achieved without a mask. Control gate 32 is protected during part of the etch by high-k dielectric layer 34 while both portions of replacement layer 36 are removed by etching but with the extensive etching high-k dielectric layer 34 over control gate 32 will be removed and ILD 52 will also undergo a comparable reduction in height. On the other hand portions of replacement layer 36 may instead be selectively removed using a photoresist patterning step to provide, for example, different gate stacks for logic and NVM select gates, or for example, between N-channel and P-channel logic gates. The example as shown is etching without a mask which leaves an opening in NVM region 12 in which high-k dielectric 34 is on the sidewalls of control gate 32 and remains on substrate 16 at the bottom of the opening. Barrier metal layer 35 is on high-k dielectric 34 in the opening both at the bottom and adjacent to control gate 32. The opening in logic region 14 has high-k dielectric on substrate 16 at the bottom of the opening and barrier metal layer 35 on high-k dielectric 34 at the bottom of the opening.

Figure 14:
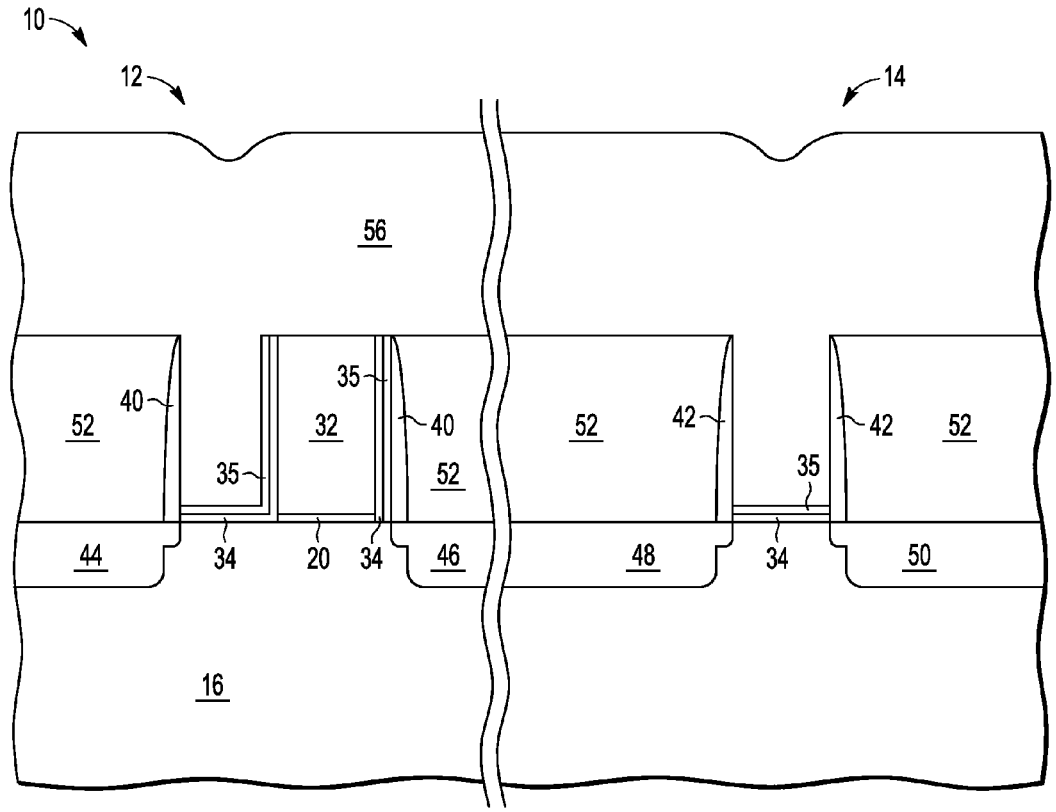
FIG. 14 is a cross section of the semiconductor device of FIG. 13 at a subsequent stage in processing.

Shown in FIG. 14 is semiconductor device 10 after forming a gate material 56 that fills openings formed by removing both portions of replacement layer 36 as shown FIG. 13. Gate material 56 may be metal or polysilicon or some combination of metal and polysilicon. Gate material 56 may be optimized for logic and select gate purposes and independent of what is best for a control gate.

Figure 15:
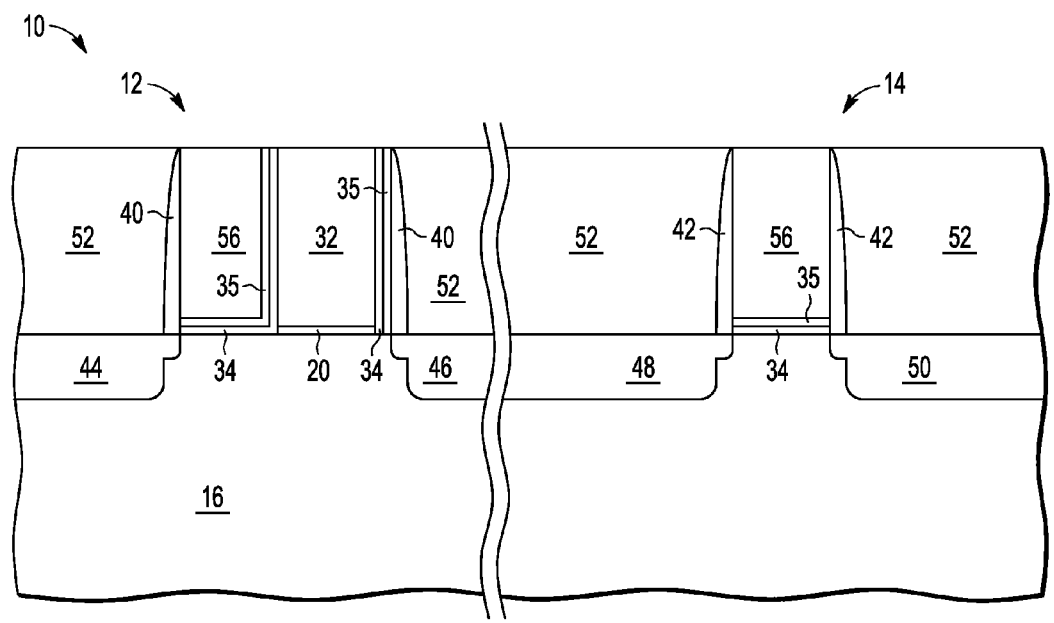
FIG. 15 is a cross section of the semiconductor device of FIG. 14 at a subsequent stage in processing.

Shown in FIG. 15 is semiconductor device 10 after performing CMP. The result is the select gate formed from a portion of gate material 56 in NVM region 12 adjacent to control gate 32 and a logic gate formed in logic region 14.

Thus an efficient manner of forming an NVM memory cell and a logic transistor is achieved in which the gate dielectrics can be high-k, the gates can be metal, and the storage layer can be nanocrystals, including metal nanocrystals.

By now it should be appreciated that a method of making a logic transistor in a logic region of a substrate and a non-volatile memory (NVM) cell in an NVM region of the substrate includes forming a charge storage layer over the substrate in the NVM region and the logic region. The method further includes forming a first conductive layer over the charge storage layer in the NVM region and the logic region. The method further includes patterning the first conductive layer and the charge storage layer to form a control gate in the NVM region and to remove the first conductive layer and the charge storage layer from the logic region. The method further includes forming a first dielectric layer over the substrate and the control gate in the NVM region and over the substrate in the logic region. The method further includes forming a barrier layer over the first dielectric layer in the NVM region and the logic region. The method further includes forming a sacrificial layer over the barrier layer in the NVM region and the logic region. The method further includes planarizing the sacrificial layer, wherein the first dielectric layer comprises a sidewall portion located along a sidewall of the control gate, between the control gate and the barrier layer and the barrier layer comprises a sidewall portion located adjacent the sidewall of the control gate, between the sidewall portion of the first dielectric layer and the sacrificial layer. The method further includes forming a first masking layer over the sacrificial layer and the control gate in the NVM region, wherein the first masking layer defines a select gate location laterally adjacent the control gate in the NVM region. The method further includes forming a second masking layer over the sacrificial layer in the logic region, wherein the second masking layer defines a logic gate location in the logic region. The method further includes using the first masking layer to remove exposed portions of the sacrificial layer in the NVM region, wherein a first portion of the sacrificial layer remains at the select gate location. The method further includes using the second masking layer to remove exposed portions of the sacrificial layer in the logic region, wherein a second portion of the sacrificial layer remains at the logic gate location. The method further includes forming a second dielectric layer in the NVM region and the logic region, wherein the second dielectric layer is formed over the first portion of the sacrificial layer, the control gate, and the second portion of the sacrificial layer. The method further includes planarizing the second dielectric layer to expose the first portion of the sacrificial layer, the control gate, and the second portion of the sacrificial layer. The method further includes removing the first portion of the sacrificial layer to result in a first opening at the select gate location and the second portion of the sacrificial layer to result in a second opening at the logic gate location, wherein each of the first opening and the second opening exposes the barrier layer. The method may have a further characterization by which the step of planarizing the sacrificial layer exposes the first dielectric layer located on the control gate, and wherein the step of forming the first masking layer is performed such that the first masking layer is directly over the control gate and a first edge of the first masking layer extends laterally from the control gate onto the sacrificial layer to define the select gate location laterally adjacent the control gate in the NVM region. The method may have a further characterization by which the step of forming the first masking layer is performed such that a second edge of the first masking layer, opposite the first edge of the first masking layer, is formed directly on the sidewall portion of the second dielectric layer or the sidewall portion of the barrier layer. The method may have a further characterization by which the step of planarizing the sacrificial layer is performed such that at least a portion of the barrier layer remains over a top surface of the control gate. The method may have a further characterization by which the first masking layer and the second masking layer are portions of a same patterned masking layer, and wherein the steps of using the first masking layer to remove exposed portions of the sacrificial layer in the NVM region and using the second masking layer to remove exposed portions of the sacrificial layer in the logic region are performed simultaneously. The method may have a further characterization by which the barrier layer comprises a metal, and the first dielectric layer comprises a high-k dielectric. The method may have a further characterization by which the step of using the first masking layer to remove exposed portions of the sacrificial layer in the NVM region results in thinning the sidewall portion of the barrier layer. The method may further include forming a select gate in the first opening at the select gate location, wherein after the select gate is formed, a portion of the first dielectric layer and a portion of the barrier layer are located between the select gate and the control gate. The method may have a further characterization by which, after the steps of using the first and second masking layers to remove exposed portions of the sacrificial layer in the NVM region and the logic region and prior to the step of forming the second dielectric layer in the NVM region and the logic region, the method further includes forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions and forming a third source/drain region in the substrate laterally adjacent a first sidewall of the second portion of the sacrificial layer and a fourth source/drain region in the substrate laterally adjacent a second sidewall of the second portion of the sacrificial layer. The method may have a further characterization by which after the step of using the first and second masking layers to remove exposed portions of the sacrificial layer in the NVM region and the logic region, and prior to the step of forming the second dielectric layer in the NVM region and the logic region, the method further includes forming a first sidewall spacer surrounding outer sidewalls of the first portion of the sacrificial layer and the control gate, wherein the sidewall portion of the barrier layer is located between the control gate and the first sidewall spacer, and a second sidewall spacer surrounding the second portion of the sacrificial layer. The method may further include, prior to the step of forming the charge storage layer, forming a third masking layer over the substrate in the logic region, wherein the charge storage layer is formed on the substrate in the NVM region and on the third masking layer in the logic region and, prior to the step of forming the first dielectric layer, removing the third masking layer. The method may have a further characterization by which the step of forming the charge storage layer includes forming a bottom dielectric layer, forming nanocrystals over the bottom dielectric layer and forming a top dielectric layer over the bottom dielectric and over and around the nanocrystals. The method may have a further characterization by which forming the bottom dielectric layer is characterized in that the bottom dielectric layer comprises a dielectric material having a high dielectric constant and forming the nanocrystals is characterized in that the nanocrystals comprise a metal. The method may have a further characterization by which, after the step of removing the first portion of the sacrificial layer to result in a first opening at the select gate location and the second portion of the sacrificial layer to result in a second opening at the logic gate location, the method further includes forming a select gate layer within the first opening on the barrier layer and a logic gate layer within the second opening on the barrier layer.

Also described is a method of making a logic transistor in a logic region of a substrate and a non-volatile memory (NVM) cell in an NVM region of the substrate. The method includes forming a nanocrystal stack layer over the substrate in the NVM region and the logic region. The method further includes forming a first conductive layer over the nanocrystal stack layer in the NVM region and the logic region. The method further includes patterning the first conductive layer and the nanocrystal stack layer to form a control gate in the NVM region and to remove the first conductive layer and the charge storage layer from the logic region. The method further includes forming a high-k dielectric layer over the substrate and the control gate in the NVM region and over the substrate in the logic region. The method further includes forming a barrier metal layer over the high-k dielectric layer in the NVM region and the logic region. The method further includes forming a sacrificial layer over the barrier metal layer in the NVM region and the logic region. The method further includes planarizing the sacrificial layer. The method further includes forming a patterned masking layer in the NVM region and the logic region, wherein the patterned masking layer comprises a first masking portion formed over the sacrificial layer and the control gate in the NVM region and a second masking portion over the sacrificial layer in the logic region, wherein the first masking portion is directly over the control gate, a first edge of the first masking portion extends laterally from the control gate onto the sacrificial layer to define a select gate location laterally adjacent the control gate in the NVM region and the second masking portion defines a logic gate location in the logic region. The method further includes using the patterned masking layer to remove exposed portions of the sacrificial layer, wherein a first portion of the sacrificial layer remains at the select gate location and a second portion of the sacrificial layer remains at the logic gate location. The method further includes forming a second dielectric layer in the NVM region and the logic region, wherein the second dielectric layer is formed over the first portion of the sacrificial layer, the control gate, and the second portion of the sacrificial layer. The method further includes planarizing the second dielectric layer to expose the first portion of the sacrificial layer, the control gate, and the second portion of the sacrificial layer. The method further includes removing the first portion of the sacrificial layer to result in a first opening at the select gate location and the second portion of the sacrificial layer to result in a second opening at the logic gate location, wherein each of the first opening and the second opening exposes the barrier metal layer. The method further includes forming a select gate layer within the first opening on the barrier metal layer and a logic gate layer within the second opening on the barrier metal layer, wherein, after the select gate layer is formed, a portion of the barrier metal layer and a portion of the high-k dielectric layer remains between the select gate layer and the control gate. The method may have a further characterization by which the step of planarizing the sacrificial layer is performed such that at least a portion of the barrier metal layer remains over a top surface of the control gate. The method may have a further characterization by which the step of using the patterned masking layer to remove exposed portions of the sacrificial layer results in thinning the sidewall portion of the barrier metal layer. The method may have a further characterization by which, after the step of using the patterned masking layer to remove exposed portions of the sacrificial layer and prior to the step of forming the second dielectric layer in the NVM region and the logic region, the method further includes forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions, forming a third source/drain region in the substrate laterally adjacent a first sidewall of the second portion of the sacrificial layer and a fourth source/drain region in the substrate laterally adjacent a second sidewall of the second portion of the sacrificial layer, and forming a first sidewall spacer surrounding outer sidewalls of the first portion of the sacrificial layer and the control gate, wherein a sidewall portion of the barrier metal layer is located between the control gate and the first sidewall spacer, and a second sidewall spacer surrounding the second portion of the sacrificial layer.

Disclosed also is a non-volatile memory (NVM) cell that includes a substrate and a select gate over the substrate. The NVM further includes a control gate over the substrate and laterally adjacent the select gate. The NVM further includes a nanocrystal stack between the control gate and the substrate, wherein the nanocrystal stack comprises a bottom dielectric, a plurality of nanocrystals on the bottom dielectric, and a top dielectric on and around the plurality of nanocyrstals. The NVM further includes a high-k gate dielectric between the select gate and the substrate and along a first sidewall of the select gate, between the first sidewall of the select gate and a first sidewall of the control gate, wherein the select gate comprises a barrier metal layer which is in physical contact with the high-k gate dielectric between the select gate and the substrate and between the first sidewall of the select gate and the first sidewall of the control gate. The NVM further includes a first source/drain region in the substrate, laterally adjacent a second sidewall of the select gate, opposite the first sidewall of the select gate. The NVM further includes a second source/drain region in the substrate, laterally adjacent a second sidewall of the control gate, opposite the first sidewall of the control gate, wherein the select gate and the control gate are between the first and second source/drain regions. The NVM may further include a second barrier metal layer adjacent a second sidewall of the control gate opposite the first sidewall of the control gate and a spacer adjacent the second barrier metal layer and the second sidewall of the control gate, wherein the second barrier metal layer is between the control gate and the spacer.

Although the invention is described herein with reference to specific embodiments, various modifications and changes can be made without departing from the scope of the present invention as set forth in the claims below. For example, the various dimensions may be different than those described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a logic transistor in a logic region of a substrate and a non-volatile memory (NVM) cell in an NVM region of the substrate, comprising:
    forming a charge storage layer over the substrate in the NVM region and the logic region;
    forming a first conductive layer over the charge storage layer in the NVM region and the logic region;
    patterning the first conductive layer and the charge storage layer to form a control gate in the NVM region and to remove the first conductive layer and the charge storage layer from the logic region;
    forming a first dielectric layer over the substrate and the control gate in the NVM region and over the substrate in the logic region;
    forming a barrier layer over the first dielectric layer in the NVM region and the logic region;
    forming a sacrificial layer over the barrier layer in the NVM region and the logic region;
    planarizing the sacrificial layer, wherein the first dielectric layer comprises a sidewall portion located along a sidewall of the control gate, between the control gate and the barrier layer and the barrier layer comprises a sidewall portion located adjacent the sidewall of the control gate, between the sidewall portion of the first dielectric layer and the sacrificial layer;
    forming a first masking layer over the sacrificial layer and the control gate in the NVM region, wherein the first masking layer defines a select gate location laterally adjacent the control gate in the NVM region;
    forming a second masking layer over the sacrificial layer in the logic region, wherein the second masking layer defines a logic gate location in the logic region;
    using the first masking layer to remove exposed portions of the sacrificial layer in the NVM region, wherein a first portion of the sacrificial layer remains at the select gate location;
    using the second masking layer to remove exposed portions of the sacrificial layer in the logic region, wherein a second portion of the sacrificial layer remains at the logic gate location;
    forming a second dielectric layer in the NVM region and the logic region, wherein the second dielectric layer is formed over the first portion of the sacrificial layer, the control gate, and the second portion of the sacrificial layer;
    planarizing the second dielectric layer to expose the first portion of the sacrificial layer, the control gate, and the second portion of the sacrificial layer; and
    removing the first portion of the sacrificial layer to result in a first opening at the select gate location and the second portion of the sacrificial layer to result in a second opening at the logic gate location, wherein each of the first opening and the second opening exposes the barrier layer.

2. The method of claim 1, wherein the step of planarizing the sacrificial layer exposes the first dielectric layer located on the control gate, and wherein the step of forming the first masking layer is performed such that:
    the first masking layer is directly over the control gate, and
    a first edge of the first masking layer extends laterally from the control gate onto the sacrificial layer to define the select gate location laterally adjacent the control gate in the NVM region.

3. The method of claim 2, wherein the step of forming the first masking layer is performed such that a second edge of the first masking layer, opposite the first edge of the first masking layer, is formed directly on the sidewall portion of the second dielectric layer or the sidewall portion of the barrier layer.

4. The method of claim 1, wherein the step of planarizing the sacrificial layer is performed such that at least a portion of the barrier layer remains over a top surface of the control gate.

5. The method of claim 1, wherein the first masking layer and the second masking layer are portions of a same patterned masking layer, and wherein the steps of using the first masking layer to remove exposed portions of the sacrificial layer in the NVM region and using the second masking layer to remove exposed portions of the sacrificial layer in the logic region are performed simultaneously.

6. The method of claim 1, wherein the barrier layer comprises a metal, and the first dielectric layer comprises a high-k dielectric.

7. The method of claim 1, wherein the step of using the first masking layer to remove exposed portions of the sacrificial layer in the NVM region results in thinning the sidewall portion of the barrier layer.

8. The method of claim 1, further comprising forming a select gate in the first opening at the select gate location, wherein after the select gate is formed, a portion of the first dielectric layer and a portion of the barrier layer are located between the select gate and the control gate.

9. The method of claim 1, wherein after the steps of using the first and second masking layers to remove exposed portions of the sacrificial layer in the NVM region and the logic region and prior to the step of forming the second dielectric layer in the NVM region and the logic region, the method further comprises:
    forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions; and
    forming a third source/drain region in the substrate laterally adjacent a first sidewall of the second portion of the sacrificial layer and a fourth source/drain region in the substrate laterally adjacent a second sidewall of the second portion of the sacrificial layer.

10. The method of claim 9, wherein after the step of using the first and second masking layers to remove exposed portions of the sacrificial layer in the NVM region and the logic region, and prior to the step of forming the second dielectric layer in the NVM region and the logic region, the method further comprises:
    forming a first sidewall spacer surrounding outer sidewalls of the first portion of the sacrificial layer and the control gate, wherein the sidewall portion of the barrier layer is located between the control gate and the first sidewall spacer, and a second sidewall spacer surrounding the second portion of the sacrificial layer.

11. The method of claim 1, further comprising:
    prior to the step of forming the charge storage layer, forming a third masking layer over the substrate in the logic region, wherein the charge storage layer is formed on the substrate in the NVM region and on the third masking layer in the logic region; and prior to the step of forming the first dielectric layer, removing the third masking layer.

12. The method of claim 1, wherein the step of forming the charge storage layer comprises:
   forming a bottom dielectric layer;
   forming nanocrystals over the bottom dielectric layer; and
   forming a top dielectric layer over the bottom dielectric and over and around the nanocrystals.

13. The method of claim 12, wherein forming the bottom dielectric layer is characterized in that the bottom dielectric layer comprises a dielectric material having a high dielectric constant and forming the nanocrystals is characterized in that the nanocrystals comprise a metal.

14. The method of claim 1, wherein after the step of removing the first portion of the sacrificial layer to result in the first opening at the select gate location and the second portion of the sacrificial layer to result in the second opening at the logic gate location, the method further comprises:
   forming a select gate layer within the first opening on the barrier layer and a logic gate layer within the second opening on the barrier layer.

15. A method of making a logic transistor in a logic region of a substrate and a non-volatile memory (NVM) cell in an NVM region of the substrate, comprising:
   forming a nanocrystal stack layer over the substrate in the NVM region and the logic region;
   forming a first conductive layer over the nanocrystal stack layer in the NVM region and the logic region;
   patterning the first conductive layer and the nanocrystal stack layer to form a control gate in the NVM region and to remove the first conductive layer and the charge storage layer from the logic region;
   forming a high-k dielectric layer over the substrate and the control gate in the NVM region and over the substrate in the logic region;
   forming a barrier metal layer over the high-k dielectric layer in the NVM region and the logic region;
   forming a sacrificial layer over the barrier metal layer in the NVM region and the logic region;
   planarizing the sacrificial layer;
   forming a patterned masking layer in the NVM region and the logic region, wherein the patterned masking layer comprises a first masking portion formed over the sacrificial layer and the control gate in the NVM region and a second masking portion over the sacrificial layer in the logic region, wherein:
      the first masking portion is directly over the control gate, a first edge of the first masking portion extends laterally from the control gate onto the sacrificial layer to define a select gate location laterally adjacent the control gate in the NVM region; and
      the second masking portion defines a logic gate location in the logic region;
   using the patterned masking layer to remove exposed portions of the sacrificial layer, wherein a first portion of the sacrificial layer remains at the select gate location and a second portion of the sacrificial layer remains at the logic gate location;
   forming a second dielectric layer in the NVM region and the logic region, wherein the second dielectric layer is formed over the first portion of the sacrificial layer, the control gate, and the second portion of the sacrificial layer;
   planarizing the second dielectric layer to expose the first portion of the sacrificial layer, the control gate, and the second portion of the sacrificial layer;
   removing the first portion of the sacrificial layer to result in a first opening at the select gate location and the second portion of the sacrificial layer to result in a second opening at the logic gate location, wherein each of the first opening and the second opening exposes the barrier metal layer; and
   forming a select gate layer within the first opening on the barrier metal layer and a logic gate layer within the second opening on the barrier metal layer, wherein, after the select gate layer is formed, a portion of the barrier metal layer and a portion of the high-k dielectric layer remains between the select gate layer and the control gate.

16. The method of claim 15, wherein the step of planarizing the sacrificial layer is performed such that at least a portion of the barrier metal layer remains over a top surface of the control gate.

17. The method of claim 15, wherein the step of using the patterned masking layer to remove exposed portions of the sacrificial layer results in thinning the sidewall portion of the barrier metal layer.

18. The method of claim 15, wherein after the step of using the patterned masking layer to remove exposed portions of the sacrificial layer and prior to the step of forming the second dielectric layer in the NVM region and the logic region, the method further comprises:
   forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions;
   forming a third source/drain region in the substrate laterally adjacent a first sidewall of the second portion of the sacrificial layer and a fourth source/drain region in the substrate laterally adjacent a second sidewall of the second portion of the sacrificial layer; and
   forming a first sidewall spacer surrounding outer sidewalls of the first portion of the sacrificial layer and the control gate, wherein a sidewall portion of the barrier metal layer is located between the control gate and the first sidewall spacer, and a second sidewall spacer surrounding the second portion of the sacrificial layer.

* * * * *